(12) United States Patent
Okabe et al.

(10) Patent No.: US 11,107,845 B2
(45) Date of Patent: Aug. 31, 2021

(54) TFT SUBSTRATE, TFT SUBSTRATE PRODUCTION METHOD, AND DISPLAY DEVICE

(71) Applicant: Sharp Kabushiki Kaisha, Sakai (JP)

(72) Inventors: Tohru Okabe, Sakai (JP); Hirohiko Nishiki, Sakai (JP); Takeshi Yaneda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/496,968

(22) PCT Filed: Mar. 22, 2018

(86) PCT No.: PCT/JP2018/011294
§ 371 (c)(1),
(2) Date: Sep. 24, 2019

(87) PCT Pub. No.: WO2018/180842
PCT Pub. Date: Oct. 4, 2018

(65) Prior Publication Data
US 2020/0381462 A1 Dec. 3, 2020

(30) Foreign Application Priority Data
Mar. 29, 2017 (JP) .............................. JP2017-065355

(51) Int. Cl.
*H01L 27/12* (2006.01)
*H01L 27/32* (2006.01)

(52) U.S. Cl.
CPC ........ *H01L 27/1251* (2013.01); *H01L 27/124* (2013.01); *H01L 27/127* (2013.01);
(Continued)

(58) Field of Classification Search
CPC ............. H01L 27/3248; H01L 27/3258; H01L 27/1251; H01L 27/124; H01L 27/1248
See application file for complete search history.

(56) References Cited

U.S. PATENT DOCUMENTS

2013/0215370 A1   8/2013   Takanishi et al.
2015/0129881 A1   5/2015   Kong et al.
(Continued)

FOREIGN PATENT DOCUMENTS

| CN | 103069334 A | 4/2013 |
|---|---|---|
| CN | 103456740 A | 12/2013 |
| JP | 2016-218452 A | 12/2016 |

*Primary Examiner* — Cuong Q Nguyen
*Assistant Examiner* — Peter M Albrecht
(74) *Attorney, Agent, or Firm* — Keating & Bennett, LLP

(57) ABSTRACT

A Thin Film Transistor (TFT) substrate includes a first semiconductor film, a first electrically conductive member provided in a layer higher than the first semiconductor film, an interlayer insulating film provided in a layer higher than the first electrically conductive member and including a first through hole, a second semiconductor film provided in a layer higher than the interlayer insulating film, a second electrically conductive member provided in a layer higher than the second semiconductor film, an organic insulating film provided in a layer higher than the second electrically conductive member and including a second through hole, and a third electrically conductive member provided in a layer higher than the organic insulating film. A contact hole extends through the first and the second through hole to the first electrically conductive member.

18 Claims, 7 Drawing Sheets

(52) U.S. Cl.
CPC ...... *H01L 27/1248* (2013.01); *H01L 27/1225* (2013.01); *H01L 27/3248* (2013.01); *H01L 27/3262* (2013.01)

(56) References Cited

U.S. PATENT DOCUMENTS

2016/0283028 A1    9/2016   Yamazaki et al.
2018/0151647 A1*   5/2018   Lee .................... H01L 27/3246

\* cited by examiner (a)

(b)

(a)

(b)

TFT SUBSTRATE, TFT SUBSTRATE PRODUCTION METHOD, AND DISPLAY DEVICE

TECHNICAL FIELD

The present invention relates to a substrate including a thin-film transistor (TFT).

BACKGROUND ART

Patent Literature 1 discloses a TFT substrate having a lower layer portion and an upper layer portion each of which includes a respective TFT.

CITATION LIST

Patent Literature

[Patent Literature 1] Japanese Patent Application Publication Tokukai No. 2016-218452 (Publication date: Dec. 22, 2016)

SUMMARY OF INVENTION

Technical Problem

In a TFT substrate whose lower layer portion and upper layer portion each include a TFT, there is a demand, for example, to reduce parasitic capacitance by increasing the thickness of an insulating film provided between the lower layer portion and the upper layer portion. Doing so, however, problematically makes it difficult to achieve a stable connection between an electrically conductive member in the lower layer portion and an electrically conductive member in the upper layer portion.

Solution to Problem

A TFT substrate in accordance with an aspect of the present invention includes: a substrate; a first semiconductor film which is provided on the substrate and serves as a channel of a TFT; a first electrically conductive member provided in a layer higher than the first semiconductor film; an interlayer insulating film which is provided in a layer higher than the first electrically conductive member and has a first through hole; a second semiconductor film provided in a layer higher than the interlayer insulating film; a second electrically conductive member provided in a layer higher than the second semiconductor film; an organic insulating film which is provided in a layer higher than the second electrically conductive member and has a second through hole; and a third electrically conductive member provided in a layer higher than the organic insulating film, the TFT substrate having a contact hole which extends through the first through hole and the second through hole to the first electrically conductive member, an entrance to the second through hole being larger than an entrance to the first through hole, the second electrically conductive member and the third electrically conductive member each being provided so as to overlap with an entrance to the contact hole, the third electrically conductive member being in contact with the first electrically conductive member and the second electrically conductive member.

Advantageous Effects of Invention

An aspect of the present invention makes it possible to achieve, in a TFT substrate having a lower layer portion including a first semiconductor film and an upper layer portion including a second semiconductor film, a stable connection between the first electrically conductive member of the lower layer portion and the second electrically conductive member of the upper layer portion, even in a case where an interlayer insulating film provided between the lower and upper layer portions is designed to be thick.

DESCRIPTION OF EMBODIMENTS

The following description will discuss some embodiments of the present invention. These embodiments are only illustrative.

Embodiment 1

Figure 1:
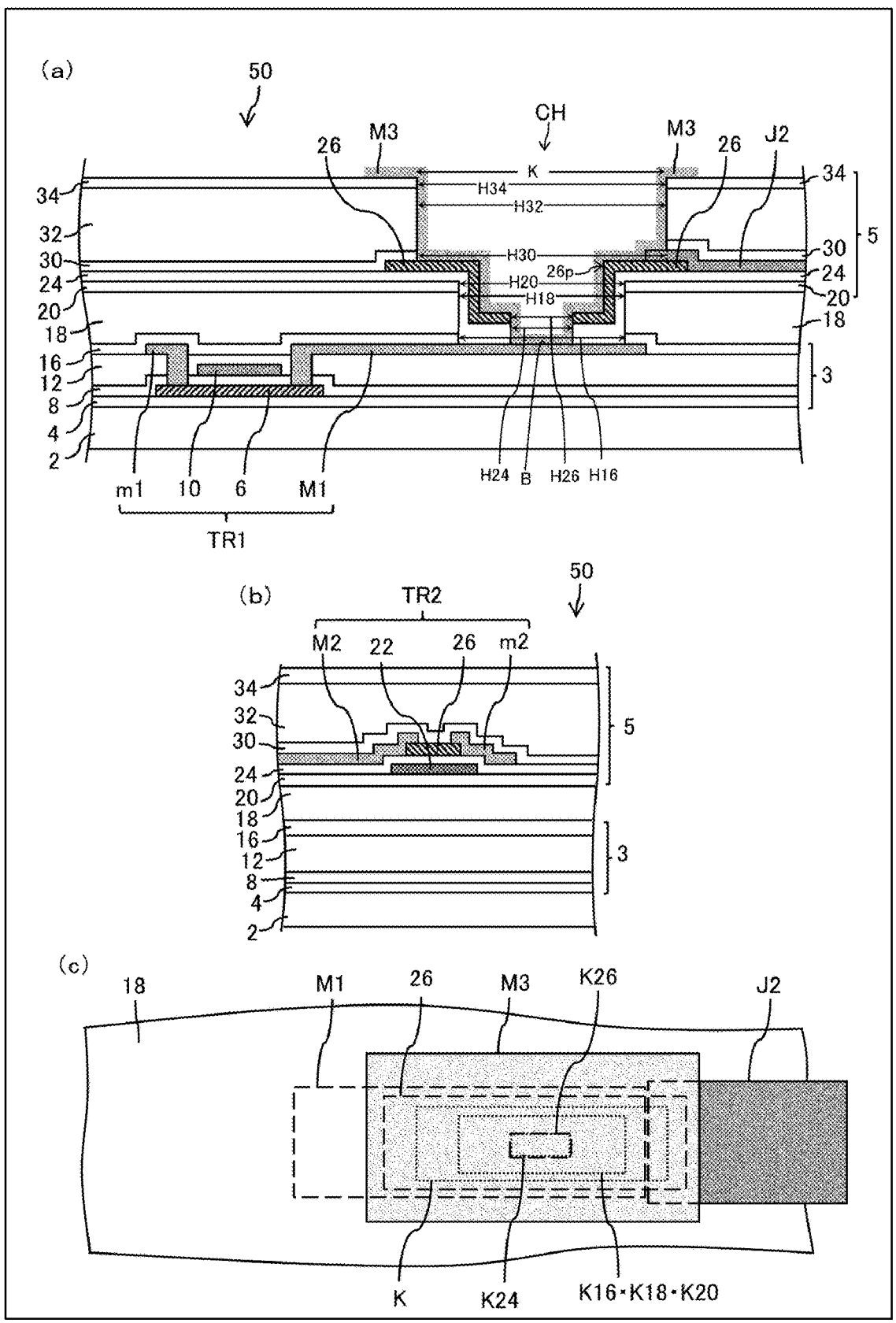
FIG. 1 consists of a cross-sectional view (a), a cross-sectional view (b), and a plan view (c), each of which illustrates a configuration of a TFT substrate in accordance with Embodiment 1 of the present invention.

(a) and (b) of FIG. 1 are each a cross-sectional view illustrating a configuration of a TFT substrate in accordance with Embodiment 1. (c) of FIG. 1 is a plan view illustrating a configuration of the TFT substrate in accordance with Embodiment 1.

As illustrated in (a) to (c) of FIG. 1, a TFT substrate 50 includes the following members, stacked in the following order: a substrate 2; an inorganic insulating film 4; a first semiconductor film 6; a first gate insulating film 8; a first gate electrode 10; an inorganic insulating film 12; drain wiring m1 and source wiring M1 (first electrically conductive member); an inorganic insulating film 16; an interlayer insulating film 18; an inorganic insulating film 20; a second gate electrode 22; a second gate insulating film 24; a second semiconductor film 26; upper layer wiring J2 (second electrically conductive member), drain wiring M2, and source wiring m2; an inorganic insulating film 30; an organic insulating film 32, an inorganic insulating film 34; and a conductive film M3 (third electrically conductive member).

A lower layer portion 3 includes the inorganic insulating film 4, the first semiconductor film 6, the first gate insulating film 8, the first gate electrode 10, the inorganic insulating film 12, the source wiring M1, the drain wiring m1, and the inorganic insulating film 16. An upper layer portion 5 includes the inorganic insulating film 20, the second gate electrode 22, the second gate insulating film 24, the second semiconductor film 26, the upper layer wiring J2, the drain wiring M2, the source wiring m2, the inorganic insulating film 30, the organic insulating film 32, the inorganic insulating film 34, and the conductive film M3. The interlayer insulating film 18 is provided between the upper layer portion 5 and the lower-4 layer portion 3.

A transistor TR1 included in the lower layer portion 3 is a top-gate type thin-film transistor (TFT) which includes the first semiconductor film 6 and the first gate electrode 10. A transistor TR2 included in the upper layer portion 5 is a bottom-gate type thin-film transistor (TFT) which includes the second gate electrode 22 and the second semiconductor film 26.

The substrate 2 is, for example, a glass substrate or a resin substrate. The substrate 2 may be flexible.

Each of the inorganic insulating film 4, the first gate insulating film 8, the inorganic insulating film 12, the inorganic insulating film 16, the inorganic insulating film 20, the inorganic insulating film 30, and the inorganic insulating film 34 is, for example, a silicon nitride film, a silicon oxide film, or a stacked film including a silicon nitride film and a silicon oxide film, and is formed, for example, by a Chemical Vapor Deposition (CVD) method.

Each of the interlayer insulating film 18 and the organic insulating film 32 is, for example, an organic resin film formed by liquid application (for example, a spin coat method or an ink jet method). The interlayer insulating film 18 and the organic insulating film 32 are each thicker than each of the inorganic insulating films.

The first semiconductor film 6 is, for example, a low-temperature polysilicon (LTPS) film. The second semiconductor film 26 is, for example, an oxide semiconductor film.

The oxide semiconductor film may contain, for example, at least one metallic element selected from among In, Ga, and Zn. For example, the oxide semiconductor film may be an In—Ga—Zn—O based semiconductor (for example, an indium gallium zinc oxide). An In—Ga—Zn—O based semiconductor is a ternary oxide of indium (In), gallium (Ga), and zinc (Zn). The ratio (compositional ratio) of In, Ga, and Zn is not limited to any particular ratio, and may be, for example, In:Ga:Zn=2:2:1, In:Ga:Zn=1:1:1, or In:Ga:Zn=1:1:2.

The oxide semiconductor film may be, for example, an In—Sn—Zn—O based semiconductor (for example, In2O3-SnO2-ZnO; InSnZnO). An In—Sn—Zn—O based semiconductor is a ternary oxide of indium (In), tin (Sn), and zinc (Zn). A channel layer may include, for example, an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, cadmium oxide (CdO), a Mg—Zn—O based semiconductor, an In—Ga—Sn—O based semiconductor, an In—Ga—O based semiconductor, a Zr—In—Zn—O based semiconductor, or a Hf—In—Zn—O based semiconductor. Note here that Al represents aluminum, Ti represents titanium, Cd represents cadmium, Ge represents germanium, Pb represents lead, Mg represents magnesium, Zr represents zirconium, and Hf represents hafnium.

Each of the first gate electrode 10, the drain wiring m1, the source wiring M1, the second gate electrode 22, the upper layer wiring J2, the drain wiring M2, the source wiring m2, and the conductive film M3 can be formed by (i) forming one or more layers of a metal such as an aluminum (Al) film, a tungsten (W) film, a molybdenum (Mo) film, a tantalum (Ta) film, a chrome (Cr) film, a titanium (Ti) film, copper (Cu) film, or an alloy of such metals by sputtering and (ii) patterning the one or more layers. Note that the conductive film M3 may be, for example, a light-transmitting metal film made with use of indium tin oxide (ITO) or indium zincum oxide (IZO).

As illustrated in (a) and (c) of FIG. 1, the TFT substrate 50 is configured such that each of the inorganic insulating film 16, the second gate insulating film 24, the interlayer insulating film 18, the inorganic insulating film 20, the inorganic insulating film 30, the organic insulating film 32, and the inorganic insulating film 34 has a respective through hole formed therein. A contact hole CH that reaches the source wiring M1 extends through a through hole H34 of the inorganic insulating film 34, a through hole H32 of the organic insulating film 32, a through hole H30 of the inorganic insulating film 30, a through hole H20 of the inorganic insulating film 20, a through hole H18 of the interlayer insulating film 18, a through hole H24 of the second gate insulating film 24, and a through hole H16 of the inorganic insulating film 16.

In a view from above (i.e., in a view from a direction normal to the substrate), (i) respective entrances to the through hole H34, the through hole H32, and the through hole H30 match each other, (ii) an entrance K20 to the through hole H20, an entrance K18 to the through hole H18, and an entrance K16 to the through hole H16 match each other and are located within the entrance to the through hole H32 and (iii) an entrance K24 to the through hole H24 is located within the entrance K18 to the through hole H18.

The upper layer wiring J2 and the conductive film M3 are formed so as to overlap with an entrance K to the contact hole CH. The conductive film M3 is in contact with the source wiring M1 and the upper layer wiring J2 and thereby creates an electrical connection between the source wiring M1 and the upper layer wiring J2.

In Embodiment 1, the contact hole CH extends through a through hole H26 of the second semiconductor film 26. The through hole H26 of the second semiconductor film 26 is located within the through hole H18 of the interlayer insulating film 18. An entrance K26 to the through hole H26 of the second semiconductor film 26 matches (i) the entrance K24 to the through hole H24 and (ii) an end B of the contact hole CH.

The second semiconductor film 26 has an overlap portion 26p that overlaps with the entrance K to the contact hole CH. The overlap portion 26p has a step-like shape which includes a portion located higher than the inorganic insulating film 20 and a portion located lower than the inorganic insulating film 20. The overlap portion 26p is provided such that (i) both the portion located higher than the inorganic insulating film 20 and the portion located lower than inorganic insulating film 20 are in contact with the conductive film M3 and (ii) the portion located higher than the inorganic insulating film 20 is in contact with the upper layer wiring J2.

In Embodiment 1, because the source wiring M1 and the upper layer wiring J2 can be connected via the conductive film M3 in the contact hole CH, it is possible to achieve a stable connection between both wirings (M1 and J2) even in a case where the interlayer insulating film 18 is designed to be thick so as to reduce parasitic capacitance between the transistor TR1 and the transistor TR2. Furthermore, the conductive film M3 is in contact, in the contact hole CH, with the second semiconductor film 26 having the step-like shape. This makes it possible to reduce the possibility that the conductive film M3, which is formed by e.g. sputtering, will suffer a step-caused disconnection in the contact hole CH.

The upper layer wiring J2 illustrated in (a) of FIG. 1 may be formed so as to be continuous with the drain wiring M2 illustrated in (b) of FIG. 1.

Figure 2:
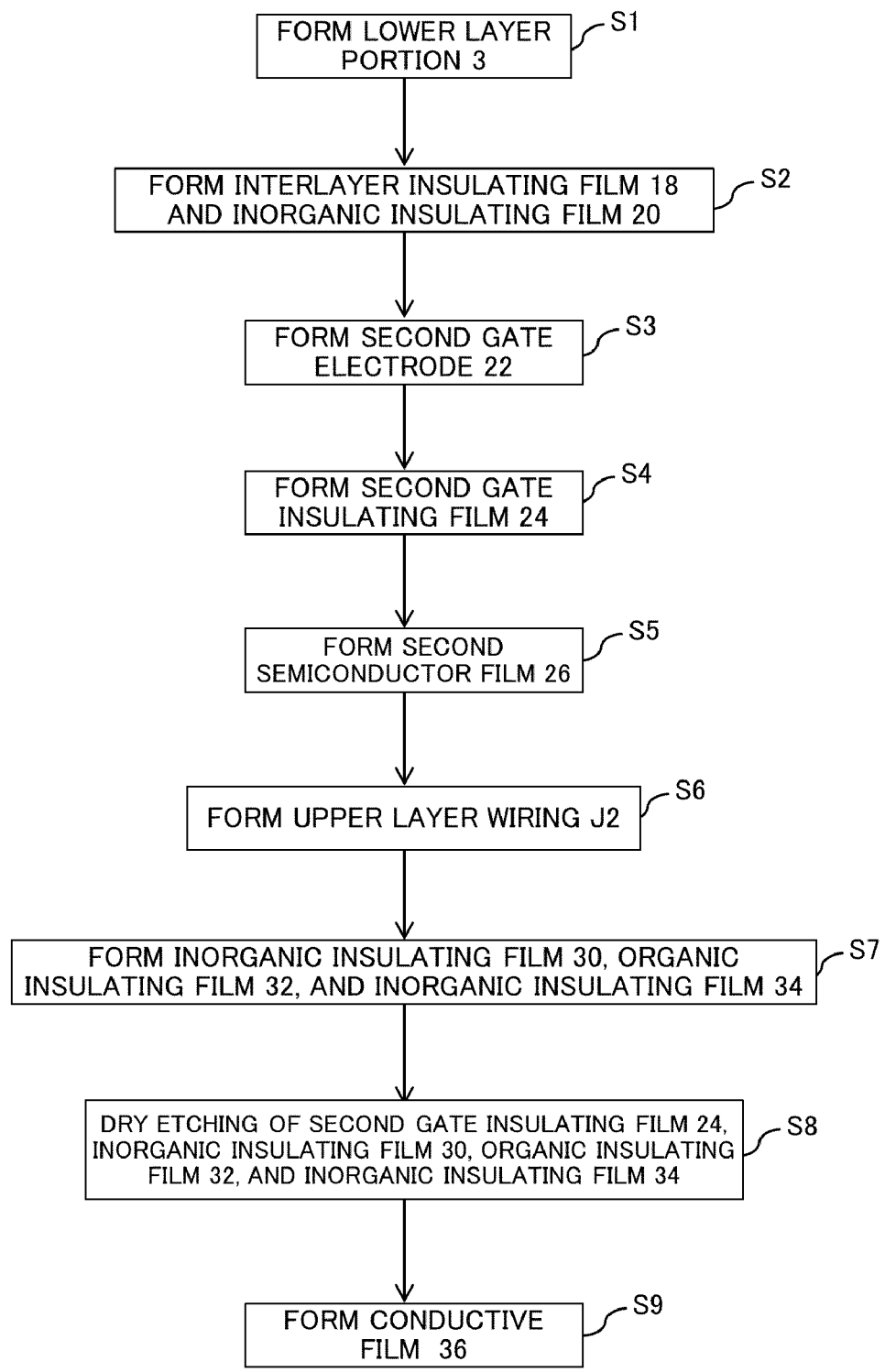
FIG. 2 is a flowchart illustrating a method of producing the TFT substrate in accordance with Embodiment 1 of the present invention.

FIG. 2 illustrates a method of producing the TFT substrate of Embodiment 1. As illustrated in FIG. 2, in step S1, the lower layer portion 3 (including the transistor TR1) is formed on the substrate 2. In step S2, (i) the interlayer insulating film 18 is formed by, for example, a liquid application method, (ii) the inorganic insulating film 20 is formed by, for example, a CVD method, and (iii) the interlayer insulating film 18 and the inorganic insulating film 20 are subsequently patterned. In step S3, the second gate electrode is formed by, for example, sputtering and is then patterned. In step S4 the second gate insulating film 24 is formed by, for example, a CVD method. In step S5, the second semiconductor film 26 is formed by, for example, sputtering and is subsequently patterned. In step S6, the upper layer wiring J2 is formed by, for example, sputtering and is subsequently patterned. In step S7, (i) the inorganic insulating film 30 is formed by, for example, a CVD method, (ii) the organic insulating film 32 is formed by, for example, a liquid application method, and (iii) the inorganic insulating film 34 is formed by, for example, a CVD method. In step S8, the inorganic insulating film 34, the organic insulating film 32, the inorganic insulating film 30, and the second gate insulating film 24 are subjected to dry etching, such that the contact hole CH is formed. In step S9, the conductive film M3 is formed by, for example, sputtering and is subsequently patterned.

In step S2, the through hole H18 of the interlayer insulating film 18 is formed such that, in a view from above, the through hole H18 is within an area which will be occupied by an entrance to the contact hole CH. In step S5, (i) the second semiconductor film 26 is formed so as to have an island-like shape which, in a view from above, includes the area which will be occupied by the entrance to the contact hole CH, and (ii) the through hole H26 of the second semiconductor film 26 is formed such that, in a view from above, the through hole H26 is in an area within the through hole H18 of the interlayer insulating film 18. In step S8, dry etching is carried out, in which the second semiconductor film 26 having the step-like shape (formed in step S5) serves as an etching stopper. In step S9, the conductive film M3 is formed in the contact hole CH.

Figure 7:
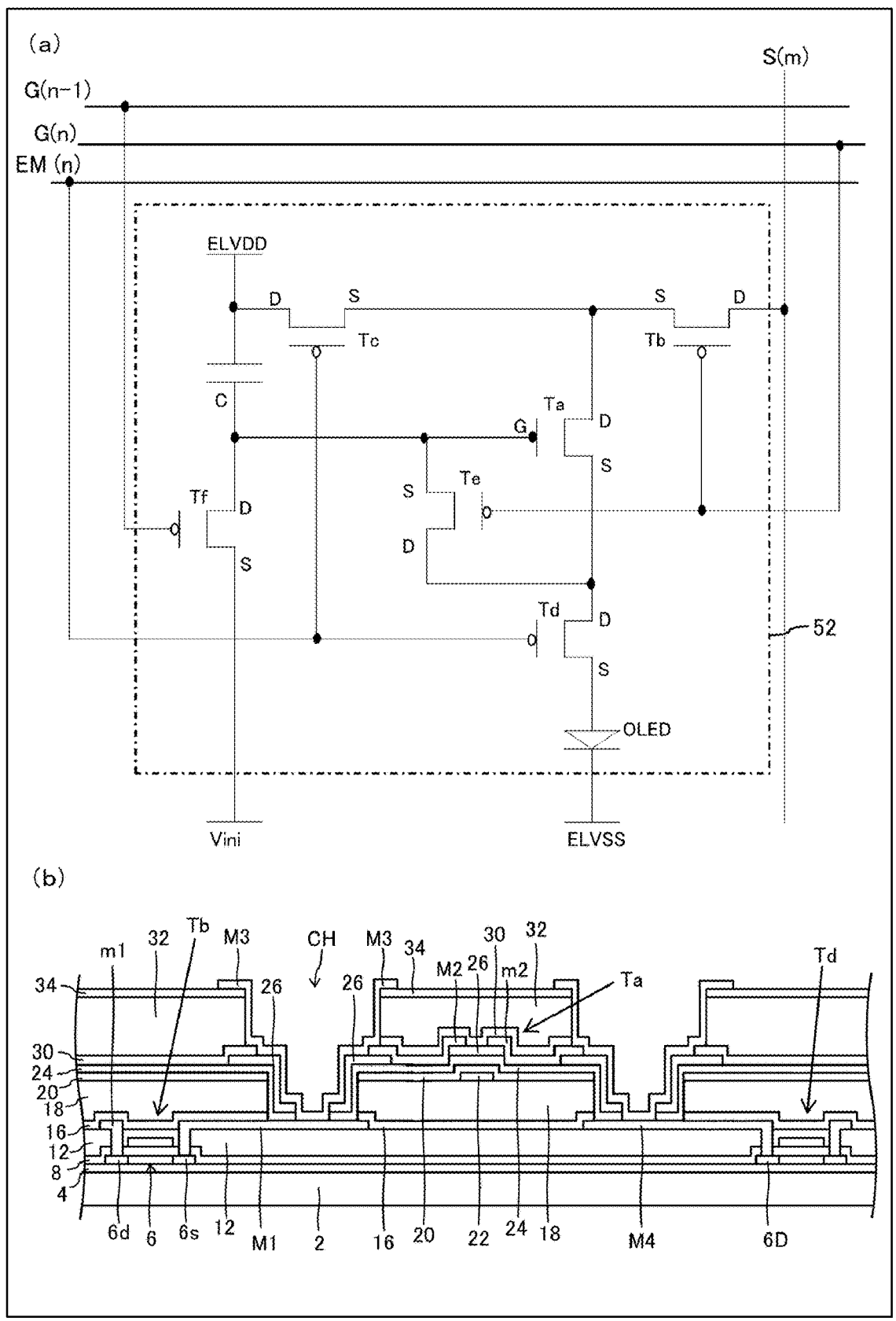
FIG. 7 consists of a circuit diagram (a) and a cross-sectional view (b), each of which illustrates another configuration of a display device in accordance with Embodiment 1 of the present invention.

FIG. 7 consists of a circuit diagram (a) and a cross-sectional view (b), each of which illustrates a configuration of a display region of a display device in accordance with an embodiment of the present invention. Provided in the display region are a plurality of data lines S(m) and a plurality of scanning signal lines G(n) which are provided so as to orthogonally cross the plurality of data lines S(m). Also provided in the display region are a plurality of light emission control lines EM(n), each of which is in one-to-one correspondence with a respective one of the plurality of scanning signal lines. Also provided in the display region are pixel circuits 52, each of which corresponds to a respective one of points where one of the plurality of data lines S(m) crosses orthogonally with one of the plurality of scanning signal lines G(n). Providing the pixel circuits 52 in this manner forms a matrix of a plurality of pixels in the display region.

Power supply lines (not illustrated) shared by each of the pixel circuits 52 are provided in the display region. More specifically, the following are provided: power supply lines (high level power supply lines) which supply a high level power supply voltage ELVDD for driving organic EL elements; a power supply line (low level power supply line) which supplies a low level power supply voltage ELVSS for driving the organic EL elements; and power supply lines (initialization power supply lines) which supply an initialization voltage Vini. The high level power supply voltage ELVDD, the low level power supply voltage ELVSS, and the initialization voltage Vini are supplied from a power supply circuit (not illustrated).

Next, the following description will discuss a configuration of the pixel circuits 52 within the display region. (a) of FIG. 7 is a circuit diagram illustrating a configuration of one of the pixel circuits 52 which one corresponds to an m-th column and an n-th row. Note that the configuration of the pixel circuits 52 described here is merely one example; other known configurations may be used. The pixel circuit 52 illustrated in (a) of FIG. 7 includes one organic EL element OLED, six transistors Ta through Tf (a drive transistor Ta, a write control transistor Tb, a power supply control transistor Tc, a light emission control transistor Td, a threshold voltage compensation transistor Te, and an initialization transistor Tf), and one capacitor C1. The transistor Ta is an n-channel transistor. Tb through Tf are p-channel transistors. The capacitor C1 is a capacitative element having two electrodes (a first electrode and a second electrode).

Terminals of the drive transistor Ta are connected as follows. A gate terminal of the drive transistor Ta is connected to (i) a source terminal of the threshold voltage compensation transistor Te, (ii) a drain terminal of the initialization transistor Tf, and (iii) the second electrode of the capacitor C1. A drain terminal of the drive transistor Ta is connected to (i) a source terminal of the write control transistor Tb and (ii) a source terminal of the power supply control transistor Tc. A source terminal of the drive transistor Ta is connected to (i) a drain terminal of the light emission control transistor Td and a drain terminal of the threshold voltage compensation transistor Te. Terminals of the write control transistor Tb are connected as follows. A gate terminal of the write control transistor Tb is connected to a scanning signal line G(n) of the n-th row. A drain terminal of the write control transistor Tb is connected to a data line S(m) of the m-th column. The source terminal of the write control transistor Tb is connected to (i) the drain terminal of the drive transistor Ta and (ii) the source terminal of the power supply control transistor Tc. Terminals of the power supply control transistor Tc are connected as follows. A gate terminal of the power supply control transistor Tc is connected to a light emission control line EM(n) of the n-th row. A drain terminal of the power supply control transistor Tc is connected to (i) a respective one of the high level power supply lines and (ii) the first electrode of the capacitor C1. The source terminal of the power supply control transistor Tc is connected to the drain terminal of the drive transistor Ta and the source terminal of the write control transistor Tb.

A channel of the transistor Ta is composed of an oxide semiconductor. Channels of the transistor Tb and the transistor Td are composed of low-temperature polysilicon (LTPS). As illustrated in (b) of FIG. 7, the drain wiring M2 of the transistor Ta is connected to a source electrode 6s of the transistor Tb via the source wiring M1, and the source wiring m2 of transistor Ta is connected to a drain electrode 6D of the transistor Td via drain wiring M4.

Embodiment 2

Figure 3:
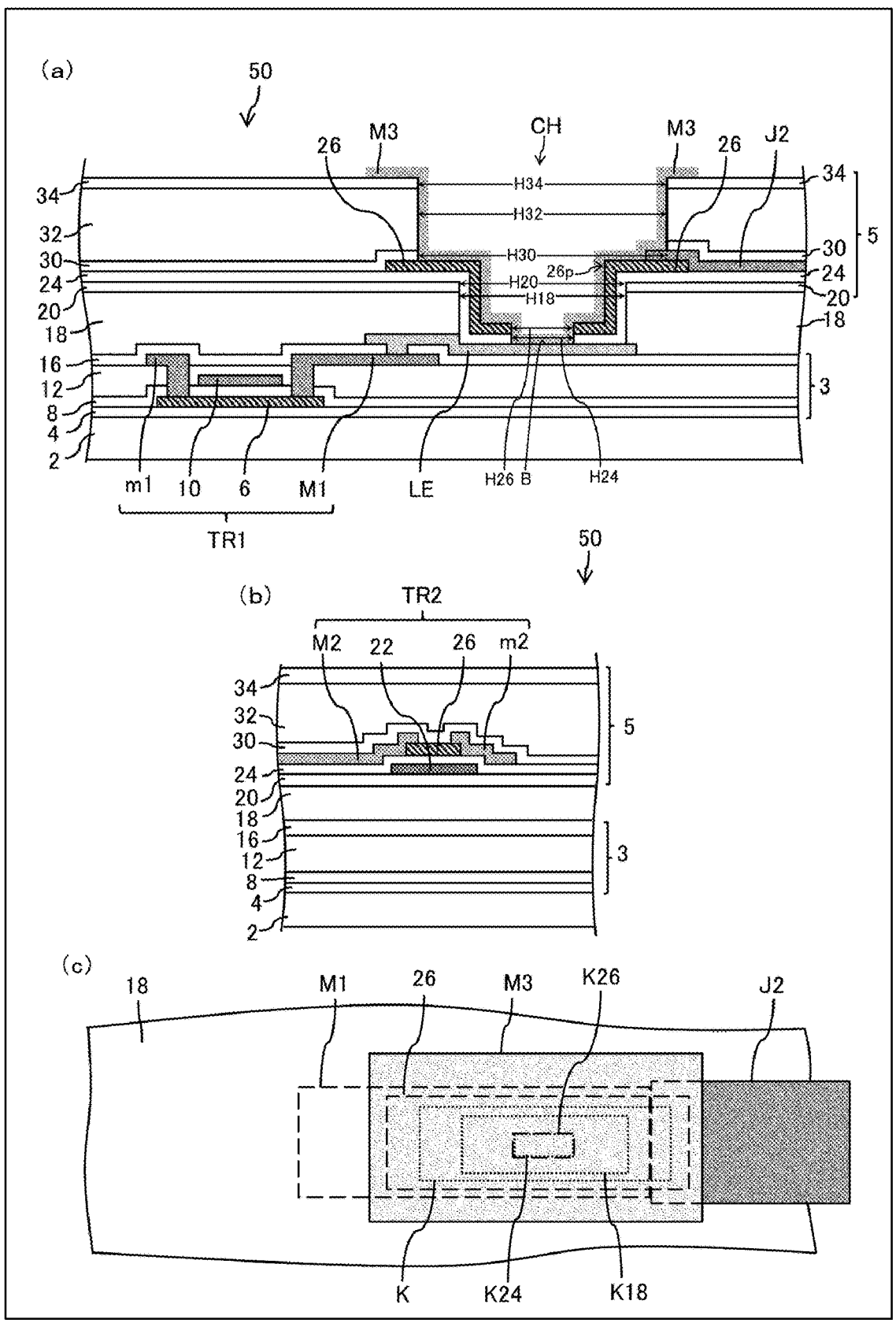
FIG. 3 consists of a cross-sectional view (a), a cross-sectional view (b), and a plan view (c), each of which illustrates a configuration of a TFT substrate in accordance with Embodiment 2 of the present invention.

In Embodiment 1, the source wiring M1 and the upper layer wiring J2 were connected via the conductive film M3, but such a configuration is non-limiting. As illustrated in FIG. 3, which illustrates Embodiment 2, it is possible to employ a configuration in which (i) a relay electrode LE which is electrically connected to source wiring M1 is provided in a layer higher than the source wiring M1 and (ii) the relay electrode LE is connected to upper layer wiring J2 via a conductive film M3. The upper layer wiring J2 illustrated in (a) of FIG. 3 may be formed so as to be continuous with drain wiring M2 illustrated in (b) of FIG. 3.

The source wiring M1 and the relay electrode LE can be connected by a contact hole which passes through an inorganic insulating film 16. The relay electrode LE may be, for example, a light-transmitting metal film made with use of indium tin oxide (ITO) or indium zincum oxide (IZO).

Embodiment 3

Figure 4:
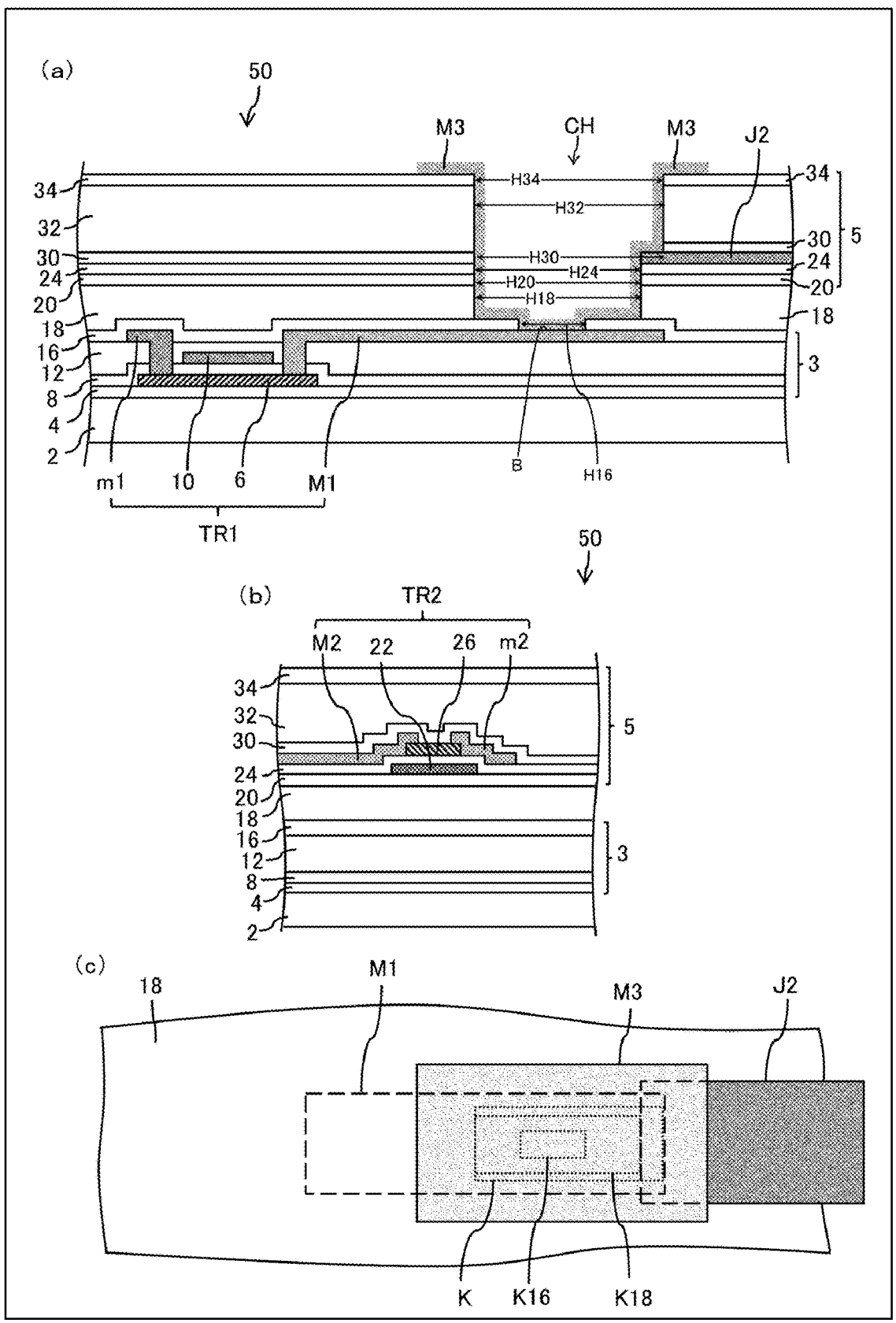
FIG. 4 consists of a cross-sectional view (a), a cross-sectional view (b), and a plan view (c), each of which illustrates a configuration of a TFT substrate in accordance with Embodiment 3 of the present invention.

As illustrated in (a) through (c) of FIG. 4, in a TFT substrate 50, each of an inorganic insulating film 16, a second gate insulating film 24, an interlayer insulating film 18, an inorganic insulating film 20, an inorganic insulating film 30, an organic insulating film 32, and an inorganic insulating film 34 has a through hole formed therein. A contact hole CH which reaches source wiring M1 extends through a through hole H34 of the inorganic insulating film 34, a through hole H32 of the organic insulating film 32, a through hole H30 of the inorganic insulating film 30, a through hole H20 of the inorganic insulating film 20, a through hole H18 of the interlayer insulating film 18, a through hole H24 of an second gate insulating film 24, and a through hole H16 of the inorganic insulating film 16.

In a view from above (i.e., in a view from a direction normal to the substrate), (i) an entrance to the through hole H34, an entrance to the through hole H32, and an entrance to the through hole H30 match each other, (ii) an entrance to the trough hole H24, an entrance to the through hole H20, and an entrance K18 to the through hole H18 match each other and are located within the entrance to the through hole H32, and (iii) an entrance K16 to the through hole H16 is located within the entrance K18 to the through hole H18.

Upper layer wiring J2 and a conductive film M3 are formed so as to overlap with an entrance K to the contact hole CH. The conductive film M3 is in contact with the source wiring M1 and the upper layer wiring J2 and thereby creates an electrical connection between the source wiring M1 and the upper layer wiring J2. The upper layer wiring J2 illustrated in (a) of FIG. 4 may be formed so as to be continuous with drain wiring M2 illustrated in (b) of FIG. 4.

In Embodiment 3, because the source wiring M1 and the upper layer wiring J2 can be connected via the conductive film M3 in the contact hole CH, it is possible to achieve a stable connection between both wirings (M1 and J2) even in a case where the interlayer insulating film 18 is designed to be thick so as to reduce parasitic capacitance between a transistor TR1 and a transistor TR2.

Embodiment 4

Figure 5:
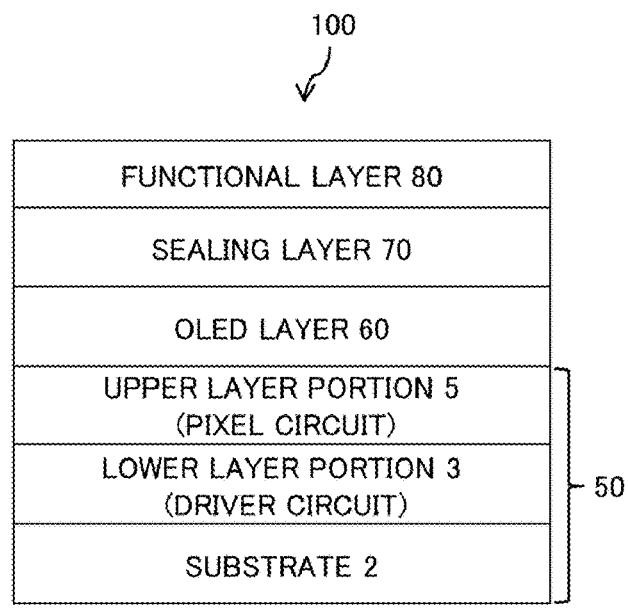
FIG. 5 is a cross-sectional view illustrating a configuration of a display device in accordance with Embodiment 4 of the present invention.
Figure 5:
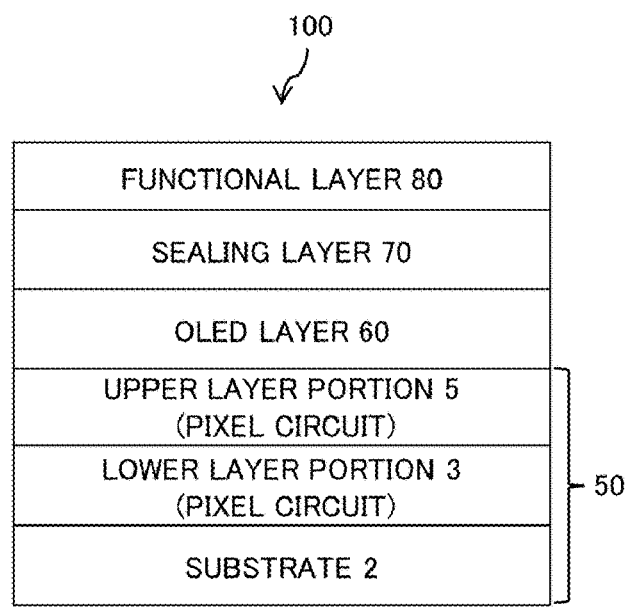

FIG. 5 is a diagram schematically illustrating a display device in accordance with Embodiment 4. A display device 100 (OLED display) in accordance with Embodiment 4 includes a TFT substrate 50 in accordance with any one of Embodiments 1 to 3, and, provided thereabove, an organic light-emitting diode (OLED) layer 60, a sealing layer 70, and a functional layer 80. The functional layer 80 may include, for example, an optical film, a touch sensor film, and a protective film.

As illustrated in (a) of FIG. 5, the display device 100 may be configured such that (i) a lower layer portion 3 including a first semiconductor film 6 (for example, LTPS) is used in a driver circuit and (ii) an upper layer portion 5 including a second semiconductor film 26 (for example, an oxide semiconductor) is used in a pixel circuit.

Alternatively, as illustrated in (b) of FIG. 5, the display device 100 may be configured such that (i) each lower layer portion 3 including a corresponding one of first semiconductor films 6 (for example, LTPS) and (ii) each upper layer portion 5 including a corresponding one of second semiconductor films 26 (for example, an oxide semiconductor) are used in a corresponding one of pixel circuits. In such a case, a configuration can be employed in which (i) each lower layer portion 3 includes a write control transistor (for example, a transistor whose channel is LTPS) of the corresponding one of the pixel circuits and (ii) each upper layer portion 5 includes a drive transistor (for example, a transistor whose channel is an oxide semiconductor) of the corresponding one of the pixel circuits.

Note that it is also possible to employ a configuration in which (i) each lower layer portion 3 includes a drive transistor (for example, a transistor whose channel is an oxide semiconductor) of the corresponding one of the pixel circuits and (ii) each upper layer portion 5 includes a write control transistor (for example, a transistor whose channel is LTPS) of the corresponding one of the pixel circuits.

Embodiment 5

Figure 6:
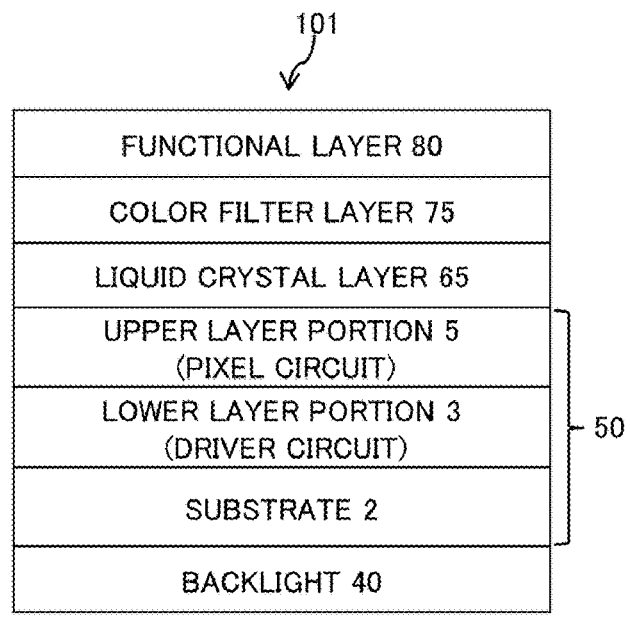
FIG. 6 is a cross-sectional view illustrating a configuration of a display device in accordance with Embodiment 5 of the present invention.
Figure 6:
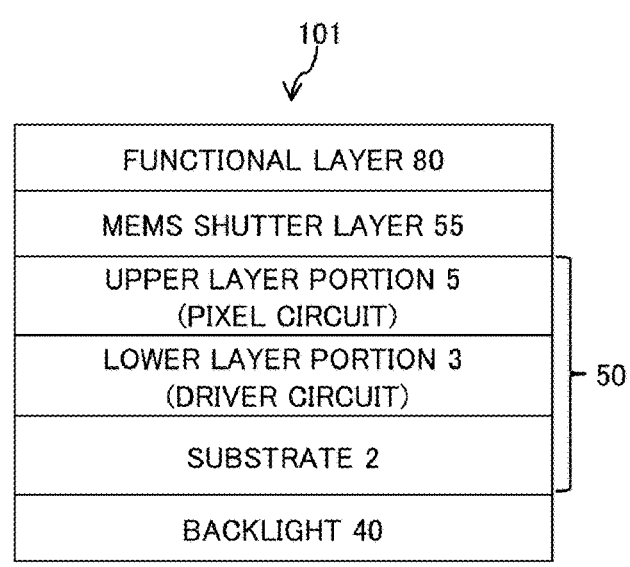

FIG. 6 is a diagram schematically illustrating a display device in accordance with Embodiment 5. A display device 101 in accordance with Embodiment 5 includes a TFT substrate 50 in accordance with any one of Embodiments 1 to 3, a backlight 40 provided on a lower surface side of the TFT substrate 50, one or more light transmission control layers provided on an upper surface side of the TFT substrate 50, and a functional layer 80 provided on the upper surface side of the TFT substrate 50.

The one or more light transmission control layers may include a liquid crystal layer 65 and a color filter layer 75 as illustrated in (a) of FIG. 6. The one or more light transmission control layers may include a micro electro mechanical system (MEMS) shutter layer 55 as illustrated in (b) of FIG. 6. In both of these cases, a configuration may be employed in which (i) a lower layer portion 3 including a first semiconductor film 6 (for example, LTPS) is used in a driver circuit, and (ii) an upper layer portion 5 including a second semiconductor film 26 (for example, an oxide semiconductor) is used in a pixel circuit.

An electro-optical element (electro-optical element whose luminance and transmissivity are controlled by current) included in the display device in accordance with some Embodiments of the present invention is not particularly limited. Possible examples of the display device in accordance with some Embodiments of the present invention include (i) an organic electro luminescence (EL) display including organic light emitting diodes (OLEDs) as electro-optical elements, (ii) an inorganic EL display including inorganic light emitting diodes as electro-optical elements, and (iii) a quantum dot light emitting diode (QLED) display including QLEDs as electro-optical elements.

Aspects of the present invention can also be expressed as follows:

Aspect 1: A TFT substrate including: a substrate; a first semiconductor film which is provided on the substrate and serves as a channel of a TFT; a first electrically conductive member provided in a layer higher than the first semiconductor film; an interlayer insulating film which is provided in a layer higher than the first electrically conductive member and has a first through hole; a second semiconductor film provided in a layer higher than the interlayer insulating film; a second electrically conductive member provided in a layer higher than the second semiconductor film; an organic insulating film which is provided in a layer higher than the second electrically conductive member and has a second through hole; and a third electrically conductive member provided in a layer higher than the organic insulating film, the TFT substrate having a contact hole which extends through the first through hole and the second through hole to the first electrically conductive member, an entrance to the second through hole being larger than an entrance to the first through hole, the second electrically conductive member and the third electrically conductive member each being provided so as to overlap with an entrance to the contact hole, the third electrically conductive member being in contact with the first electrically conductive member and the second electrically conductive member.

Aspect 2: The TFT substrate in accordance with, for example, Aspect 1, in which the contact hole extends through a third through hole of the second semiconductor film.

Aspect 3: The TFT substrate in accordance with for example, Aspect 2, in which the third through hole is located within the first through hole.

Aspect 4: The TFT substrate in accordance with, for example, Aspect 3, in which an entrance to the third through hole matches an end of the contact hole.

Aspect 5: The TFT substrate in accordance with, for example, any one of Aspects 2 through 4, in which: the second semiconductor film has an island-like shape; and in a case where the TFT substrate is viewed from above, (i) the entrance to the first through hole is located inward of outer edges of the second semiconductor film, and (ii) an entrance to the third through hole is located inward of the entrance to the first through hole.

Aspect 6: The TFT substrate in accordance with, for example, any one of claims 2 through 5, in which the second semiconductor film has an overlap portion which (i) overlaps with the entrance to the contact hole and (ii) is in contact with the third electrically conductive member.

Aspect 7: The TFT substrate in accordance with, for example, Aspect 6, in which the overlap portion has a step-like shape.

Aspect 8: The TFT substrate in accordance with, for example, Aspect 6 or 7, in which the overlap portion is in contact with the second electrically conductive member.

Aspect 9: The TFT substrate in accordance with, for example, any one of Aspects 1 through 8, in which a substance of which the second semiconductor film is composed differs from a substance of which the first semiconductor film is composed.

Aspect 10: The TFT substrate in accordance with, for example, any one of Aspects 1 through 9, in which the first electrically conductive member is provided in the same layer as conduction electrodes of the TFT.

Aspect 11: The TFT substrate in accordance with, for example, any one of Aspects 1 through 9, in which the first electrically conductive member is provided in a layer higher than conduction electrodes of the TFT.

Aspect 12: The TFT substrate in accordance with, for example, any one of Aspects 1 through 11, in which the first semiconductor film is composed of polysilicon, and the second semiconductor film is composed of an oxide semiconductor.

Aspect 13: A method of producing a TFT substrate, including the step of: (a) providing the following on a substrate: a first semiconductor film which serves as a channel of a TFT; a first electrically conductive member provided in a layer higher than the first semiconductor film; an interlayer insulating film which is provided in a layer higher than the first electrically conductive member and has a first through hole; a second semiconductor film provided in a layer higher than the interlayer insulating film; a second electrically conductive member provided in a layer higher than the second semiconductor film; an organic insulating film which is provided in a layer higher than the second electrically conductive member and has a second through hole; a third electrically conductive member provided in a layer higher than the organic insulating film; and a contact hole which extends through the first through hole and the second through hole to the first electrically conductive member, wherein in the step (a), the second electrically conductive member and the third electrically conductive member are provided in a manner so as to overlap with an entrance to the contact hole, so that the third electrically conductive member is in contact with the first electrically conductive member and the second electrically conductive member.

Aspect 14: The method in accordance with, for example, Aspect 13, in which the contact hole extends through a third through hole of the second semiconductor film.

Aspect 15: A display device including: the TFT substrate in accordance with any one of Aspects 1 through 12.

Aspect 16: The display device in accordance with, for example, Aspect 15, further including: an OLED layer above the TFT substrate.

Aspect 17: The display device in accordance with, for example, Aspect 16, in which: a lower layer portion including the first semiconductor film is used in a driver circuit; and an upper layer portion including the second semiconductor film is used in a pixel circuit.

Aspect 18: The display device in accordance with, for example, Aspect 16, in which (i) each lower layer portion including a corresponding one of first semiconductor films and (ii) each upper layer portion including a corresponding one of second semiconductor films are used in a corresponding one of pixel circuits.

Aspect 19: The display device in accordance with, for example, Aspect 18, in which: the corresponding one of the pixels includes a drive transistor, a write control transistor, and a light emission control transistor; the corresponding one of the first semiconductor films serves as a channel of the write control transistor and a channel of the light emission control transistor; and the corresponding one of the second semiconductor films serves as a channel of the drive transistor.

Aspect 20: The display device in accordance with, for example, Aspect 19, in which: a conduction electrode of the drive transistor is electrically connected to a conduction electrode of the write control transistor; and another conductive electrode of the drive transistor is electrically connected to a conduction electrode of the light emission control transistor.

The present invention is not limited to the embodiments, but can be altered by a skilled person in the art within the scope of the claims. The present invention also encompasses, in its technical scope, any embodiment derived by combining technical means disclosed in differing embodi-

REFERENCE SIGNS LIST

2: Substrate
3: Lower layer portion
5: Upper layer portion
6: First semiconductor film
18: Interlayer insulating film
26: Second semiconductor film
26p: Overlap portion
32: Organic insulating film
50: TFT substrate
100, 101: Display device
CH: Contact hole
M1: Source wiring (first electrically conductive member)
J2: Upper layer wiring (second electrically conductive member)
M3: Conductive film (third electrically conductive member)
H18: Through hole of interlayer insulating film
H26: Through hole of second semiconductor film
H32: Through hole of organic insulating film

The invention claimed is:

1. A Thin Film Transistor, (TFT) substrate comprising:
a substrate;
a first semiconductor film which is provided on the substrate and serves as a channel of a TFT;
a first electrically conductive member provided in a layer higher than the first semiconductor film;
an interlayer insulating film which is provided in a layer higher than the first electrically conductive member and has a first through hole;
a second semiconductor film provided in a layer higher than the interlayer insulating film;
a second electrically conductive member provided in a layer higher than the second semiconductor film;
an organic insulating film which is provided in a layer higher than the second electrically conductive member and has a second through hole; and
a third electrically conductive member provided in a layer higher than the organic insulating film,
the TFT substrate having a contact hole which extends through the first through hole and the second through hole to the first electrically conductive member,
an entrance to the second through hole being larger than an entrance to the first through hole,
the second electrically conductive member and the third electrically conductive member each being provided so as to overlap with an entrance to the contact hole,
the third electrically conductive member being in contact with the first electrically conductive member and the second electrically conductive member; and
the contact hole extends through a third through hole of the second semiconductor film.

2. The TFT substrate as set forth in claim 1, wherein the third through hole is located within the first through hole.

3. The TFT substrate as set forth in claim 2, wherein an entrance to the third through hole matches an end of the contact hole.

4. The TFT substrate as set forth in claim 1, wherein:
the second semiconductor film has an island-like shape; and
in a case where the TFT substrate is viewed from above, (i) the entrance to the first through hole is located inward of outer edges of the second semiconductor film, and (ii) an entrance to the third through hole is located inward of the entrance to the first through hole.

5. The TFT substrate as set forth in claim 1, wherein the second semiconductor film has an overlap portion which (i) overlaps with the entrance to the contact hole and (ii) is in contact with the third electrically conductive member.

6. The TFT substrate as set forth in claim 5, wherein the overlap portion has a step-like shape.

7. The TFT substrate as set forth in claim 5, wherein the overlap portion is in contact with the second electrically conductive member.

8. The TFT substrate as set forth in claim 1, wherein a substance of which the second semiconductor film is composed differs from a substance of which the first semiconductor film is composed.

9. The TFT substrate as set forth in claim 1, wherein the first electrically conductive member is provided in the same layer as conduction electrodes of the TFT.

10. The TFT substrate as set forth in claim 1, wherein the first electrically conductive member is provided in a layer higher than conduction electrodes of the TFT.

11. The TFT substrate as set forth in claim 1, wherein the first semiconductor film is composed of polysilicon, and the second semiconductor film is composed of an oxide semiconductor.

12. A method of producing a Thin Film Transistor (TFT) substrate, comprising the step of:
(a) providing the following on a substrate:
a first semiconductor film which serves as a channel of a TFT;
a first electrically conductive member provided in a layer higher than the first semiconductor film;
an interlayer insulating film which is provided in a layer higher than the first electrically conductive member and has a first through hole;
a second semiconductor film provided in a layer higher than the interlayer insulating film;
a second electrically conductive member provided in a layer higher than the second semiconductor film;
an organic insulating film which is provided in a layer higher than the second electrically conductive member and has a second through hole;
a third electrically conductive member provided in a layer higher than the organic insulating film; and
a contact hole which has an end extending through the first through hole and the second through hole to the first electrically conductive member,
wherein in the step (a), an entrance to the second through hole is formed so as to be larger than an entrance to the first through hole, and the second electrically conductive member and the third electrically conductive member are provided in a manner so as to overlap with an entrance to the contact hole, so that the third electrically conductive member is in contact with the first electrically conductive member and the second electrically conductive member; and
the contact hole extends through a third through hole of the second semiconductor film.

13. A display device comprising:
the TFT substrate recited in claim 1.

14. The display device as set forth in claim 13, further comprising:
an OLED layer above the TFT substrate.

15. The display device as set forth in claim 14, wherein:
a lower layer portion including the first semiconductor film is used in a driver circuit; and an upper layer portion including the second semiconductor film is used in a pixel circuit.

16. The display device as set forth in claim 14, wherein (i) each lower layer portion including a corresponding one of first semiconductor films and (ii) each upper layer portion including a corresponding one of second semiconductor films are used in a corresponding one of pixel circuits.

17. The display device as set forth in claim 16, wherein:
the corresponding one of the pixel circuits includes a drive transistor, a write control transistor, and a light emission control transistor;
the corresponding one of the first semiconductor films serves as a channel of the write control transistor and a channel of the light emission control transistor; and
the corresponding one of the second semiconductor films serves as a channel of the drive transistor.

18. The display device as set forth in claim 17, wherein:
a conduction electrode of the drive transistor is electrically connected to a conduction electrode of the write control transistor; and
another conductive electrode of the drive transistor is electrically connected to a conduction electrode of the light emission control transistor.

* * * * *